United States Patent [19]

Pokrandt

[11] 4,121,122
[45] Oct. 17, 1978

[54] CURRENT SENSING CIRCUITRY

[76] Inventor: Kurt Pokrandt, 101-1406 Laburnum St., Vancouver, British Columbia V6J 3W3, Canada

[21] Appl. No.: 753,368

[22] Filed: Dec. 22, 1976

[51] Int. Cl.² .................... H03K 5/153; H03K 5/20
[52] U.S. Cl. ............................. 307/362; 307/311; 307/363
[58] Field of Search ............... 307/311, 350, 362, 363; 250/551

[56] References Cited

U.S. PATENT DOCUMENTS 3,967,257 6/1976 Hager ........................... 307/311 X
4,015,150 3/1977 Jones ............................ 307/311

FOREIGN PATENT DOCUMENTS 958,080 11/1974 Canada .......................... 307/311

Primary Examiner—John Zazworsky
Attorney, Agent, or Firm—Phillips, Moore, Weissenberger, Lempio & Majestic

[57] ABSTRACT

A current sensing circuit arrangement for controlling the response of a circuit electrically isolated from the circuit in which sensed current is flowing is disclosed. The input portion of the circuit arrangement provides paths for D.C. input current, one through a current sensing element and another through a light emitting diode circuit. The current-to-voltage characteristic of the current sensing element is such that changes in voltage across the element are substantially less than proportional to changes in current through the element. The light emitting diode circuit is connected in parallel with the current sensing element and produces light energy dependent on the voltage across the element. Light energy so produced is received by an electrically isolated light sensitive semiconductor device which device is for controlling the response of an output control circuit.

5 Claims, 3 Drawing Figures

CURRENT SENSING CIRCUITRY

BACKGROUND OF THE INVENTION

This invention relates generally to circuitry for use in current sensing applications where it is desired to produce an electrically isolated control signal output dependent on the magnitude of an input current, particularly in (but not limited to) applications where the maximum input current encountered may be one or more orders of magnitude greater than the minimum input current that must be sensed.

As an example of applications where such circuit requirements and input conditions exist, reference can be made to certain continuity monitoring circuits used in connection with high voltage circuit breakers. Where the speed of activation of the circuit breaker is important, it is common to provide for voltage forcing of the circuit breaker trip solenoid which causes a relatively high activation current (trip current) to pass through the solenoid. Such high activation current may be substantially higher than the minimum current necessary to cause activation.

Circuit breakers of this type are often used to protect very expensive equipment, hence it is important that they operate reliably when called upon to do so. However, they may not be called upon to operate for extended periods of time. In the interim, the electrical continuity of the trip solenoid may, by some mechanism, become damaged or otherwise deteriorate. A common method of detecting that such damage or deterioration may have occurred is to provide for the passage of a relatively low current (continuity current) through the trip solenoid and continuously sense the presence or absence of such current. The continuing presence of a continuity current is generally a reliable indication that the circuit breaker will activate properly if so required. Conversely, the absence of continuity current is generally a reliable indication that a fault may have developed in the trip solenoid. A function of a continuity monitoring circuit is to sense the presence or absence of continuity current and provide a warning or suitable output control signal when the input current drops below the desired level of continuity current.

The magnitude of the continuity current is an externally controlled predetermined minimum value which must necessarily be less than the drop-out current threshold of the trip solenoid. Owing to hysterisis effects, the drop-out current threshold may be considerably less than the previously mentioned minimum activation current.

Hence, the current sensing circuitry of the continuity monitoring circuit must reliably sense a relatively low continuity current (ie. 10 milliamperes) and must tolerate relatively high voltage forced trip current (ie. 5 amperes). The input resistance of the current sensing circuitry should be low at high currents so that an inordinately high voltage is not required to force the desired trip current and to minimize power losses. Likewise, the input inductance of the current sensing circuitry should be minimal to avoid an adverse effect on trip current rise time. Otherwise the advantage of using a high trip current tends to be negated.

A known method of monitoring the continuity of circuit breaker trip solenoids involves the use of saturable reactors having a D.C. input winding and an A.C. output winding. The A.C. impedance of the output winding increases as current through the input winding decreases. The design should be such that when the input current through the input winding decreases below the desired level of continuity current, the increased impedance of the output winding will cause the triggering of a switch or some other appropriate response which, in turn, for example, may be used to sound an alarm. The only part of the monitoring circuit which is electrically connected to the trip solenoid circuit is the input winding of the saturable reactor connected in series with the trip solenoid.

There are several disadvantages to the use of saturable reactors. Included among these is the fact that the input winding of a saturable reactor necessarily introduces an unwanted inductance in the path of trip current. Also, difficult design problems are encountered. The input winding of the saturable reactor must have the capacity to carry large trip current with relative ease and there must be sufficient turns of this winding to ensure saturation of the reactor in the presence of relatively low continuity current. As the number of turns of input winding is increased, both the input impedance and the physical bulk of the reactor is increased. The use of such a reactor will likely be substantially limited to the particular purpose for which it is designed.

In the foregoing example, the input winding of a saturable reactor formed the basic current sensing element. In many applications, linear resistance means (ie. a current shunt) are commonly used as the current sensing element. But, in certain applications where input current may vary over a wide range, the use of a linear device becomes impractical or virtually impossible. The resistance which the linear resistance must have will be dictated by the minimum current that must be sensed. This resistance may produce voltages beyond a safe or useful level in the presence of high input currents - assuming that such high input currents can be made to flow. Accordingly, the use of a linear resistance may impose restrictions on the range of input currents.

Accordingly, it is an object of the present invention to provide a current sensing circuit arrangement for sensing D.C. current that may vary over a wide range of magnitudes and which permits electrical isolation between the circuit in which sensed current is flowing and an electrically isolated circuit controlled in response to the magnitude of such sensed circuit.

A further object of the present invention is that such circuit arrangement present a relatively high resistance to relatively low D.C. input currents and a relatively low resistance to relatively high D.C. input currents.

Another object of the invention is that such circuit arrangement have a relatively low inductance so as not to unduly impede otherwise rapid changes in the current being sensed.

SUMMARY OF THE INVENTION

The present invention provides new and improved circuitry for use in current sensing applications where it is desired to produce an electrically isolated control signal output dependent on the magnitude of an input current. It is well adapted for use in applications where a wide range of input currents may be encountered, but it can also be used in applications where only a narrow range of input currents is encountered, or in applications where it is desired to sense only a particular level of current. As will be shown subsequently, a particular embodiment of the invention can be adapted to replace continuity monitoring circuits that presently use saturable reactors as the current sensing element.

In one aspect of the present invention, there is provided a circuit arrangement comprising a current sensing element having a current-to-voltage characteristic which is substantially logarithmic, a light emitting diode circuit connected in parallel with the current sensing element, and an active light sensitive device adapted to form part of an output control circuit. In the preferred embodiment, the current sensing element comprises a plurality of series connected semiconductor diodes. Such diodes have a relatively low effective resistance at high currents, but, owing to their substantially logarithmic current-to-voltage characteristic, have a relatively high effective resistance at low currents. Their inductance, if any, is negligible. When a voltage develops across the sensing element in response to an input current, a corresponding current will flow through the light emitting diode circuit causing the light emitting diode to produce light energy. The light sensitive device, electrically isolated from the other elements of the circuit arrangement, is positioned to receive light energy produced by the light emitting diode, and its electrical characteristics are altered by such light energy. This circuit arrangement is connected in the circuit path of a circuit breaker trip solenoid such that current flowing through the solenoid also flows through the current sensing element (a portion of which current diverts through the parallel light emitting diode circuit).

For the purpose of the present invention, the term "light energy" when used in the context of light energy produced by a light emitting diode includes light energy having a characteristic wavelength outside the visible light spectrum. For example, coupling devices incorporating a light emitting diode which produces "light energy" in the infrared region and a light sensitive device responsive to such "light energy" are well known and may be used in the present invention.

It is not necessary that the current sensing element comprise series connected semiconductor diodes. Generally, the desired function of the current sensing element is to exhibit the characteristics of series connected diodes as discussed above. The applicant prefers the use of diodes because they are relatively simple and inexpensive two-terminal devices. However, another suitable element may be used - for example, as is well known, transistors may be used to perform the function of diodes.

In a further aspect of the present invention, there is provided circuitry comprising the basic circuit arrangement just discussed additionally including an output control circuit that produces an output control signal in response to light energy received by the light sensitive device. According to this aspect of the invention there is also provided circuit means to increase the sensitivity of the circuitry at low input currents.

The subject matter of the present invention is particularly pointed out and distinctly claimed in the claims. In order that its structure and operation and further features may be better understood, the invention will now be described in greater detail, in part by way of reference to a particular example, and with reference to the accompanying drawing.

DESCRIPTION OF THE PREFERRED EMBODIMENT

Figure 1:
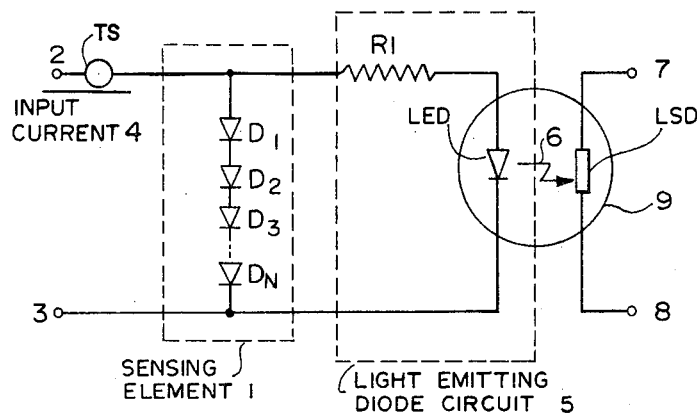
FIG. 1 is an electrical circuit diagram illustrating a preferred embodiment of the invention.

Referring now to FIG. 1, there is shown a current sensing element 1 comprising a plurality of semiconductor diodes $D_1$, $D_2$, $D_3$, ... $D_N$ connected in a series circuit between a pair of terminals 2 and 3 adapted to be connected to a source of current (not shown). There is also shown a light emitting diode circuit 5 connected in parallel with the sensing element 1 and comprising a resistor R1 connected in series with a light emitting diode LED. A trip solenoid TS of a circuit breaker (not shown) is interposed between terminal 2 and the source of current. Input current 4 from the source of current will flow through trip solenoid TS into the circuit at terminal 2 and out of the circuit at terminal 3. The plurality of diodes $D_1$, $D_2$, $D_3$, ... $D_N$ and the LED are arranged to conduct current in the forward direction when input current 4 flows from the source of current. Input current 4 is monitored by the circuit of FIG. 1 through the sensing action of sensing element 1 which produces a voltage dependent on the magnitude of input current 4. The voltage developed across the current sensing element determines the current that will flow through the light emitting diode circuit 5 and therefore the intensity of light energy produced by the LED. (It will appreciated that the voltage that develops across current sensing element 1, although entirely determined by the magnitude of input current 4, is also dependent on the magnitude of the resistance of the light emitting diode circuit 5 relative to the magnitude of the resistance of the current sensing element 1. Over the major portion of the range of operation of the circuit, it is generally contemplated that the resistance of the light emitting diode circuit 5 will be much greater than the resistance of the current sensing element 1. However, this is not necessarily always true, particularly at very low values of input current 4 where the resistance of diodes $D_1$, $D_2$, ... $D_N$ will necessarily appear relatively high. Indeed, a substantial portion of input current 4 may pass through light emitting diode 5 when such input current is very low.) The use of diodes $D_1$, $D_2$, ... $D_N$ as current-sensing elements gives rise to a logarithmic current-to-voltage characteristic which can be usefully exploited, as will be discussed in further detail below.

There is also shown generally in FIG. 1 a solid state light sensitive semiconductor device LSD positioned to receive light energy 6 emitted by the LED. The device has a pair of spaced contacts connected to terminals 7 and 8 adapted to be connected to an output control circuit (not shown). The LED and LSD are compatible devices. Light energy 6 produced by the LED in response to the flow of input current 4 alters the electrical characteristics of the LSD.

Excellent electrical isolation may be achieved between the sensing element 1 and the light emitting diode circuit 5 on the one hand and the LSD on the other. Preferably, the LED and the LSD are encapsulated in a casing 9 which shields the LSD from external light energy to prevent such light energy from affecting the operation of the LSD.

The type of light sensitive device used may vary depending on the particular application. If a light sensitive silicon controlled rectifier or a light sensitive triac is used the circuit arrangement of FIG. 1 can be operated as a current activated switch. The silicon controlled rectifier would be useful in applications where it was desired to switch on an unidirectional current in an output control circuit. The triac would be useful where it was desired to switch on a bidirectional current in an output control circuit. In applications where it is desired to control a variable current in an output control circuit or to shape circuit response characteristics in an output control circuit with respect to an input current 4, a light sensitive transistor is useful. The use of a light sensitive transistor will be discussed in greater detail hereinafter.

The resistor R1 acts to limit the current through the LED. Its resistance must be at least large enough to limit the current through the LED below its specified maximum current rating at the highest input current 4 to be encountered. The maximum current that will flow through the LED may be determined with reference to the maximum voltage that will appear across the sensing element 1.

The number of diodes used for the sensing element 1 in FIG. 1 will depend on the particular application, the forward conduction characteristics of the diodes, and the characteristic forward voltage drop of the LED. A convenient rule is to use the minimum number of diodes necessary to cause a forward bias across the LED greater than the characteristic forward voltage drop of the LED (for example 1.4 volts) when input current 4 is the minimum input current to be sensed. However, this is not to say that the circuit arrangement cannot be used in applications where such forward bias is not present at the minimum input current - but simply that the signal produced by the LED may otherwise be very low causing only slight variation in the electrical characteristics of the light sensitive transistor. Accordingly, the sensitivity of circuitry intended to respond to such slight variations may have to be particularly high to impart adequate overall sensitivity to a current sensing circuit.

The substantially logarithmic current-to-voltage characteristics of forward conducting diodes impart a very important feature to the sensing element 1. As the current through the sensing element increases, there will be a less then proportional corresponding increase in the voltage across the sensing element. Accordingly, the input current 4 can be increased a substantial amount without producing the excessive voltages that would otherwise result if a linear resistive sensing element was used. By way of example, it has been observed that four diodes producing a forward voltage drop of about 2.1 volts at 4 milliamperes produce a forward voltage drop of only about 3.4 volts at 4 amperes. Hence, while the effective resistance of the diodes is about 525 ohms at 4 milliamperes, the effective resistance is only about 0.85 ohms at 4 amperes. In contrast, a linear resistance producing 2.1 volts at 4 milliamperes would theoretically produce 2100 volts at 4 amperes, — obviously an impractical result.

In presenting a relatively low effective resistance to high currents and a relatively high effective resistance to low currents, the forward conducting diodes allow current to be sensed over a wider range than could otherwise be achieved if a linear resistive sensing element was used. Moreover, levels of current well in excess of any particular current or range of currents that is, in a strict sense, being "sensed" are not unduly impeded and can be easily tolerated. However, although these advantages are available, it is contemplated that the present invention could equally well be used in applications where a relatively narrow range of currents or a specific level of current was of interest.

The light emitting diode circuit 5 illustrates the simplest arrangement of that circuit contemplated. In some applications it may be desirable to include additional features such as noise suppression circuitry and reverse voltage protection circuitry.

For various reasons, the external source (not shown) that produces input current 4, or some other external source, may produce unacceptable noise voltages across terminals 2 and 3 or generate unacceptable noise components in input current 4 which, unless suppressed, may cause spurious misoperation of a circuit incorporating the circuit of FIG. 1 in a current monitoring application. Likewise, for various reasons, external sources may from time-to-time produce high reverse voltages across terminals 2 and 3 (ie. the voltage at terminal 3 being a high positive value with respect to terminal 2) which may damage the light emitting diode circuit 5 or current sensing element 1 unless suppressed.

Figure 2:
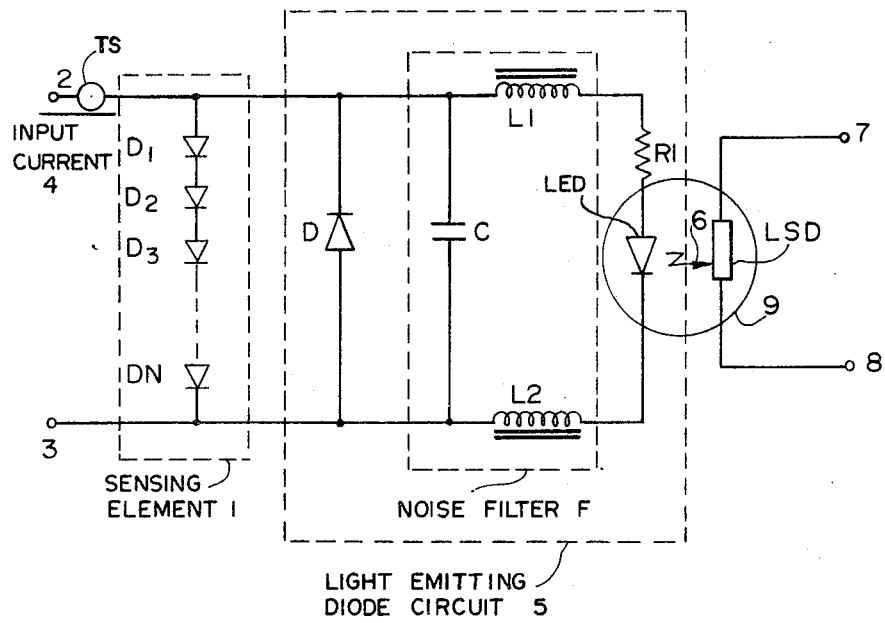
FIG. 2 is an electrical circuit diagram illustrating a preferred embodiment of the invention and further illustrating an example of techniques that can be used to suppose electrical noise and to protect the circuitry against reverse voltage inputs.

FIG. 2 illustrates an example where noise suppresion circuitry and reverse voltage protection circuitry are added to the light emitting diode circuit 5 of FIG. 1. The elements of FIG. 1 are repeated in FIG. 2 and have been assigned the same letter and number designations. The noise suppression circuitry is comprised of the noise filter F. Reverse voltage protection is provided by the diode D. These elements do not effect in any substantive manner the normal characteristics of the circuit arrangement. The component values of the elements of the noise filter F are chosen having regard for the characteristics of the noise signals that are expected to be encountered (such as noise frequency or frequencies). Capacitor C tends to suppress spurious voltage noise signals appearing across the sensing element 1. The coils, L1 and L2, further suppress noise by inhibiting noise generated currents that would tend to flow through the LED. The particular structure of a noise filter F will also depend on the characteristics of the noise signals. The structure shown is given by way of example only and it is contemplated that differing structures could readily be designed by those knowledgeable in the art of designing noise filters.

Diode D, providing reverse voltage protection for the LED, is connected in parallel relation to the sensing element 1. The use of such a diode may be very desirable in some applications to lessen the possibility of circuit damage caused by high reverse voltages that might otherwise appear across terminals 2 and 3. The diode D also aids to suppress noise. In some applications, such matters may be of little or no concern and the use of a reverse voltage protection diode may not be felt warranted. In other applications, the diode may be used with a noise filter F as shown in FIG. 2, or it may be used in applications where a noise filter is not used.

Figure 3:
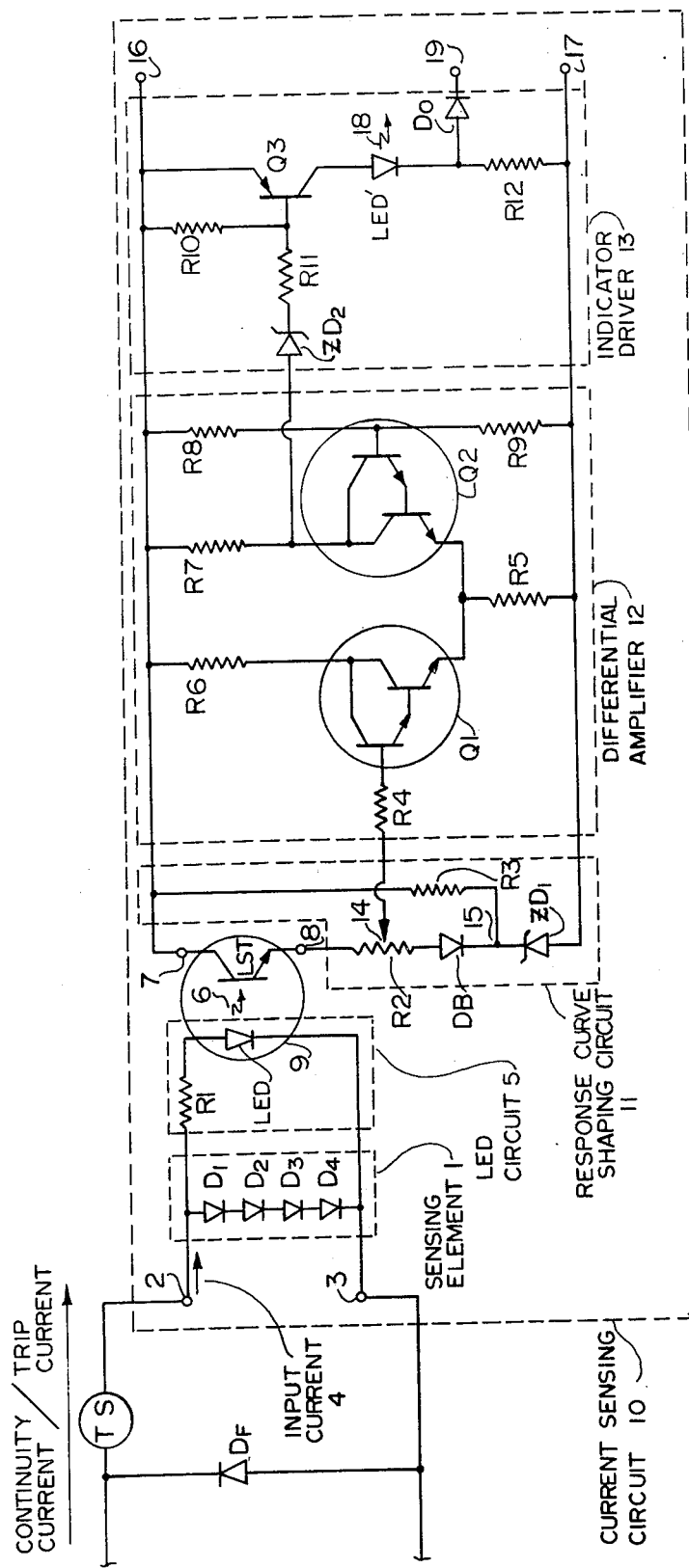
FIG. 3 is an electrical circuit diagram illustrating an application of the present invention to sense continuity current flowing through a circuit breaker trip solenoid.

FIG. 3 shows a current sensing circuit 10 which produces discrete output control signals (a visible light signal 18 and a voltage signal at terminal 19) depending on the magnitude of input current 4. It represents a specific embodiment of a more generalized current sensing circuit producing an electrically isolated output control signal depending on the magnitude of input current. Specifically current sensing circuit 10 of FIG. 3 is designed for use as a trip solenoid continuity monitoring circuit and includes special means (response curve shaping circuit 11) increasing sensitivity of the current sensing circuit at low input currents so that the presence or absence of continuity current through the trip solenoid TS can reliably be sensed. It is also designed to readily accept and tolerate trip current much in excess of the continuity current.

The basic circuit arrangement of FIG. 1 is substantially reproduced in FIG. 3, the difference being that a specific number of diodes (four) $D_1$, $D_2$, $D_3$ and $D_4$ comprise the current sensing element 1, and, a specific light sensitive device, — a light sensitive transistor LST, is used for output control. The letter and number designations used in FIG. 1 are used to identify corresponding elements in FIG. 3.

A portion of the external path through which continuity current and trip current flows, including a trip solenoid TS, is shown connected to terminals 2 and 3 of the current sensing circuit 10. There is also shown (apart from the sensing circuit) a free-wheeling diode DF bridging both the input of the current sensing circuit and the trip solenoid. The purpose of the free-wheeling diode is to suppress "indicative kick" that may occur on cessation of trip current. It portects the LED against high reverse voltages that may occur and suppresses electrical noise that may induce spurious misoperation of the circuit.

The structure and operation of the current sensing circuit 10 will now be discussed.

In FIG. 3, light sensitive transistor LST controls the operation of an output control circuit comprising generally a response curve shaping circuit 11, a differential amplifier 12, and an indicator driver 13. A D.C. power input from D.C. power means (not shown) is applied to the output control circuit across terminals 16 and 17, the positive potential side of the D.C. power means being connected to terminal 16 and the negative potential side being applied to terminal 17 thereby supplying a fixed operating potential difference — it being understood that the terms "positive" and "negative" are used in the sense of relative to each other.

The most important aspect of the output control circuit shown is the response curve shaping circuit 11 comprising resistor R3 and zener diode $ZD_1$ connected in series across the power input to provide a fixed voltage reference at point 15, and variable resistor R2 and blocking diode $D_B$ connected in series between terminal 8 and the fixed voltage reference at point 15. Terminal 8 is effectively the input of the response curve shaping circuit and the wiper contact of variable resistor R2 coincides with the output 14 of the response curve shaping circuit.

Before discussing the response curve shaping circuit in detail, it should first be noted that the differential amplifier 12 in combination with the indicator driver 13 acts as a voltage level detector switch. However, differential amplifier 12 has a limited signal processing capability because transistor Q1 cannot turn on if the input voltage of the differential amplifier is below its characteristic signal handling threshold as determined by resistors R5, R6, R7, R8 and R9.

The purpose of the response curve shaping circuit is to increase the sensitivity of the current sensing circuit 10 at low values of input current 4 so that low input currents can be usefully sensed. It adapts the signal produced by the light sensitive transistor LST to the signal processing capability of the following circuitry.

Fixed voltage reference 15 provides a biasing voltage for the input of the differential amplifier. Any current conducted by the light sensitive transistor will produce a proportional voltage drop across variable resistor R2 which is superimposed on the sum of the bias and the forward voltage drop of blocking diode $D_B$. Assuming that the loading of the differential amplifier on the response curve shaping circuit is negligible, the voltage at the output of the response curve shaping circuit (input of the differential amplifier) will be the IR drop across the part of variable resistor R2 below its wiper contact, plus the bias voltage plus the forward voltage drop across the blocking diode $D_B$.

Variable resistor R2 allows the current sensing circuit 10 to be easily calibrated to sense the absence of a particular continuity current. The minimum input current that can be sensed is determined when the wiper of variable resistor R2 is at the top of R2. The differential amplifier then, in effect, receives current directly from the emitter of the light sensitive transistor LST.

The value of resistor R2 is chosen so that transistor Q1 will be turned on at a minimum input current sufficiently below continuity current to allow for calibration adjustment. As the value of R2 is increased, the minimum input current that can be sensed will become lower. But, preferably this value is not excessive because the loading of the differential amplifier becomes more significant.

It is also possible to provide a well defined upper limit of adjustablility by adding a fixed resistance between variable resistor R2 and the blocking diode $D_B$. Its value would be relatively small in relation to the value of variable resistance R2 thereby providing improved adjustment resolution when the wiper contact of R2 is positioned near the lower end of R2 in FIG. 3. In this respect, it will be appreciated that the voltage at terminal 8 (the input of the response curve shaping circuit) increases very rapidly as input current 4 increases above the minimum input current that can be sensed. Moreover, the rate of increase becomes greater with increasing input current (until saturation levels are reached). Accordingly, if sensitive adjustment is desired towards the lower end of variable resistor R2, a fixed resistor should preferably be inserted as aforesaid defining an upper limit of adjustment.

Obviously, variable resistor R2 could be replaced by two separate resistors with the output 14 of the response curve shaping circuit being taken from between the two resistors, but, in general, it would be unusual to locate off-the-shelf components having the desired values of resistance to sense a particular continuity current. However, again in general, it is contemplated that means for calibration and adjustment could be provided at a later stage of an output control circuit incorporating the response curve shaping circuit shown in FIG. 3. Likewise, it is readily apparent that alternate means for providing a fixed voltage reference could be used, the basic criteria being that the reference preferably provides a relatively low input resistance.

The voltage at the output 14 of the response curve shaping circuit will depend on the magnitude of the current flowing into the response curve shaping circuit as controlled by the conductivity of light sensitive transistor LST. The conductivity of the light sensitive transistor will be determined by the intensity of light energy 6 emitted by the LED which, in turn, will be dependent on the magnitude of input current 4. In general, as input current 4 increases, the intensity of light energy 6, the conductivity of the light sensitive transistor, and, consequently, the voltage at output 14 will increase.

Little need be said about the circuit design of the differential amplifier 12 and the indicator driver 13. The art of designing differential amplifiers and indicator drivers and voltage level detector switches is well known and alternate designs could undoubtedly be designed by those skilled in the art. However, it should be noted that an appropriate selection of values for the resistors in the differential amplifier can make the current sensing circuit sensitive to very low input currents. In a specific example hereinafter where component values are given, a continuity monitoring circuit adjusted to sense a 10 milliamp continuity current is discussed. The lower limit of adjustment is 2 milliamps. An upper limit of adjustment, 15 milliamps, is also provided. But the circuit can be made sensitive to input currents as low as 50 microamps by selecting resistors R8 and R9 in the differential amplifier so that the signal handling threshold of the differential amplifier is moved nearer to the bias voltage provided at the fixed voltage reference (ie. point 15 in FIG. 3). In this region the loading of the response curve shaping circuit by the differential amplifier becomes significant. To obtain a range of sensed current with an even lower limit of adjustment, say in the range with a lower limit of 20 microamps and an upper limit of 100 microamps, without increasing the number of diodes used in the sensing element 1, then the voltage at fixed reference point 15 has to be chosen at a higher value (then the 5.1 volts provided by the zener diode $ZD_1$ in the specific example). Also, the current into differential amplifier 12 required to turn on transistor Q1 must be reduced. By using metal oxide field effect transistors, a differential amplifier sensitive to very low input currents can be realized.

It should be understood that the embodiment of the present invention as a current sensing circuit producing an output control signal is intended to include generally an output control circuit that produces an output control signal depending on the electrical characteristics of a light sensitive semiconductor device which forms part of a basic circuit arrangement as shown in FIG. 1. Accordingly, an output control circuit comprising only the response curve shaping circuit as shown in FIG. 3 would, for example, be within the ambit of this embodiment of the invention, for an output control signal would be produced (ie. at output 14 of FIG. 3) which output signal can be used as the input to other circuitry that, by definition, would not be regarded as part of the output control circuit but rather as circuitry that was controlled by the output control circuit.

Accordingly, the operation of the differential amplifier and the indicator driver will be considered only in a general manner as it relates to the present example under consideration.

As previously mentioned, the combination of the differential amplifier and the indicator driver operates as a voltage level detector switch. Transistor Q3 is controlled in a switching mode depending on the bias across zener diode ZD2. This bias is determined by the output voltage of the differential amplifier at the collector of compound transistor Q2 which voltage is controlled by the input voltage of the differential amplifier (ie. the output voltage of the response curve shaping circuit at 14). When the input voltage of the differential amplifier is zero, the output voltage will be a minimum biasing zener diode ZD2 into its breakdown region. In this condition, base current flows in transistor Q3 saturating Q3 and allowing a maximum current to flow in its collector circuit. Light emitting diode LED' is caused to produce a visible light signal 18 and an output voltage signal appears at terminal 19.

As the input voltage of the differential amplifier increases, the collector voltage of compound transistor Q2 will increase, eventually to the point where zener diode ZD2 will no longer be biased into its breakdown region. Base current and collector current will cease to flow in transistor Q3, light emitting diode LED' will cease to emit light energy, and the output voltage signal at terminal 19 will disappear.

The switching of transistor Q3 can be made to occur just below the desired level of continuity current by adjustment of variable resistor R2 in the response curve shaping circuit. If the gain of the differential amplifier is high (as it should preferably be), the switching action of transistor Q3 will be well defined because hysterisis effects will be minimized.

The output control signal appearing at output terminal 19 can be used, for example, as the input of a multiple input NOR gate (not shown) which, in turn, is used to control the operation of an audible alarm (not shown). Similar output control signals from circuits similar to that shown in FIG. 3 could be fed to the remaining inputs of the NOR gate. If the magnitude of the input current being sensed by any one of the several current sensing circuits dropped below the desired level of continuity current for that circuit, the audible alarm would sound. The light emitting diode LED', repeated in each of the several current sensing circuits, would indicate which circuit caused the alarm to sound thereby identifying which of the several trip solenoids might be at fault.

A circuit similar to that shown in FIG. 3 has been constructed using the following component values:

| | |
|---|---|
| $D_1,D_2,D_3,D_4$ | ST 210 |
| $D_B, D_O$ | 1N4002 |
| Optical Coupler (LED,LST) | FPLA - 810 |
| Q1, Q2 | MPS - A14 |
| Q3 | 2N4235 |
| $ZD_1$ | 1N4733 |
| $ZD_2$ | 1N4740 |
| LED' | SLV110 |
| R1 | 47 ohms |
| R2 | 5 kohms |
| R3, R6, R7 | 4.7 kohms |
| R4, R11 | 20 kohms |
| R5 | 1 kohm |
| R8 | 82 kohms |
| R9 | 27 kohms |
| R10 | 27 kohms |
| R12 | 630 ohms, 2 watts |

In addition, a 150 ohm resistor was inserted between variable resistor R2 and the blocking diode. Control power was supplied by a 28 volt direct current source. In its particular application, the circuit was adjusted to sense the presence or absence of a continuity current equal to about 10 milliamperes, but could, by adjusting variable resistor R2 be set to sense the presence or absence of currents from 2 to 15 milliamperes. The trip currents encountered were about 5 amperes. Currents as low as 50 microamperes could be sensed by adjusting R8 and R9.

It is thus apparent that new and improved circuitry for use in current sensing applications is provided by the present invention. While the use of the invention has been described in detail with respect to a particular application for sensing relatively low currents, it is to be understood that active light sensitive semiconductor devices other than a light sensitive transistor can be used, depending on the application, and that a great variety of circuit structures for the output control circuit could be used — for example, to maximize sensitivity of the current sensing circuit at medium or high current levels, or to achieve some other desired output characteristic. Accordingly, the present invention has use in diverse current sensing applications.

I claim:

1. A current sensing circuit arrangement, comprising:
   (a) a plurality of series connected diodes providing a first D.C. current path from a first point to a second point so that current flows in the forward direction through each of said diodes when a positive voltage is applied to said first point relative to said second point;
   (b) a light emitting diode circuit connected in parallel with said series connected diodes for producing light energy dependent on the voltage across said current sensing element when current flows in said first path from said first point to said second point;
   (c) a light sensitive transistor electrically isolated from said light emitting diode circuit and positioned to receive said light energy produced, said light sensitive transistor having a base for receiving said light energy, an emitter and a collector;
   (d) an output control circuit, comprising:
      (i) a control circuit input operatively connected to said light sensitive transistor;
      (ii) a control circuit output;
      (iii) a high input impedance, high gain amplifier having an amplifier input and an amplifier output, said amplifier output operatively connected to said control circuit output;
      (iv) voltage reference means for providing a fixed voltage reference at a voltage reference point;
      (v) first resistance means connected between said control circuit input and said amplifier input;
      (vi) second resistance means and a blocking diode connected in series between said amplifier input and said voltage reference point.

2. A current sensing circuit as defined in claim 1 wherein said first resistance means and said second resistance means comprise respective portions of a resistor having a voltage tap between said portions, said tap being connected to said amplifier input and being adjustable in position along said resistor to vary the relative resistance of said portions.

3. A current sensing circuit as defined in claim 1 wherein said light emitting diode circuit comprises a light emitting diode and resistance means connected in series therewith for limiting the maximum current through said light emitting diode, said light emitting diode and resistance means providing a second D.C. current path from said first point to said second point, said light emitting diode being disposed to conduct current in the forward direction and produce said light energy when current flows in the second path from said first point to said second point.

4. A current sensing circuit as defined in claim 2 wherein said light emitting diode circuit comprises a light emitting diode and resistance means connected in series therewith for limiting the maximum current through said light emitting diode, said light emitting diode and resistance means providing a second D.C. current path from said first point to said second point, said light emitting diode being disposed to conduct current in the forward direction and produce said light energy when current flows in the second path from said first point to said second point.

5. A current sensing circuit as defined in claim 1 wherein the voltage at said amplifier output switches from a first discrete value to a second discrete value when current flowing through said current sensing circuit from said first point to said second point drops below a predetermined threshold level.

* * * * *